| (12) United States Patent<br>Gronbach | (10) Patent No.: US 7,706,696 B2<br>(45) Date of Patent: Apr. 27, 2010 |
|---|---|

| (54) | PILOT TONE BIAS CONTROL | (52) | U.S. Cl. ..................................... 398/198 |
|---|---|---|---|
| (75) | Inventor: Siegfried Karl Gronbach, Bubenreugh (DE) | (58) | Field of Classification Search ................ 398/162, 398/198 |
| | | | See application file for complete search history. |
| (73) | Assignee: Alcatel-Lucent USA Inc., Murray Hill, NJ (US) | (56) | References Cited |
| | | | U.S. PATENT DOCUMENTS |
| ( * ) | Notice: Subject to any disclaimer, the term of this patent is extended or adjusted under 35 U.S.C. 154(b) by 1013 days. | | 5,726,794 A * 3/1998 Tajima ...................... 359/249<br>6,539,038 B1 * 3/2003 Wilkerson et al. ......... 372/38.02<br>6,687,451 B1 * 2/2004 Sikora ....................... 398/187 |
| | | | * cited by examiner |
| (21) | Appl. No.: 11/437,907 | | *Primary Examiner*—Shi K Li |
| (22) | Filed: May 19, 2006 | | (74) *Attorney, Agent, or Firm*—Wall & Tong, LLP |
| (65) | Prior Publication Data | (57) | ABSTRACT |
| | US 2007/0269222 A1    Nov. 22, 2007 | | A method and apparatus for dynamically compensating for phase deviations using two synchronous rectifiers in a quadrature constellation and a delay line. |
| (51) | Int. Cl.<br>*H04B 10/04*    (2006.01)<br>*H04B 10/12*    (2006.01) | | |
| | | | 20 Claims, 4 Drawing Sheets |

600

PILOT TONE BIAS CONTROL

FIELD OF INVENTION

The invention relates generally to the field of optical high speed data transmission and, more specifically, pilot tone bias control of a Mach-Zehnder modulator (MZM).

BACKGROUND OF INVENTION

Optical high speed data signals are typically generated by modulating light of a continuous wave (CW) laser using a modulator such as a Mach Zehnder modulator (MZM) rather than directly modulating the laser bias current. The resulting non-return to zero (NRZ) signal is optionally shaped to a return to zero (RZ) signal by use of a second MZM. The bias points of the MZMs and their phase relations need to be dynamically controlled to compensate for temperature, aging and device tolerance.

The established control mechanisms for NRZ bias, RZ bias and RZ phase differ, but the mechanisms are all based on modulating a bias point with a pilot tone. The modulation results in the average optical output power being modulated with the pilot tone. Non-optimal selection of the bias point results in higher power variation of the output signal. The power variation is filtered, measured and demodulated with a synchronous rectifier to be used as feedback signal for control of the bias point. The synchronous rectifier works best if its signals are in phase. Utilizing a non-optimally phased signal to the synchronous rectifier leads to a decreased feedback gain and in turn to a less accurate bias point control. The use of this non-optimal bias point for biasing the modulators results in decreased system performance and loss of transmitted information.

Conventionally, compensation is done by a fixed phase adjustment. The phase deviation is calculated at the design phase or measured at the testing phase and then used as a fixed input signal phase offset to the synchronous rectifier. The fixed phase adjustment has many disadvantages. Additional time and effort are required at the testing phase of the system. No compensation is provided for environmental changes (i.e., temperature, component aging) of the system. Moreover, no compensation is available for frequency dependent phase deviation caused by tolerance of pilot tone.

SUMMARY OF THE INVENTION

Various deficiencies of the prior art are addressed by the present invention of a quadrature demodulation for pilot tone based bias control of a modulator.

In accordance with the present invention, a method for dynamically compensating for phase deviations is provided. In particular, the phase of a pilot tone is shifted by 90 degrees. The shifted pilot tone is combined with a modulated signal. The combined signal is filtered thereby providing a control signal for a delaying element. The pilot tone is delayed dynamically in response to the control signal. The adjusted pilot tone is provided as the reference signal to a first synchronous rectifier in a demodulator.

In accordance with another aspect of the present invention, an apparatus is provided for compensating for the phase deviation of the signal. In particular, the present invention provides a demodulator that has two synchronous rectifiers. A first synchronous rectifier includes a first multiplier, for multiplying a modulated signal with a reference signal, and a first filter, for filtering the first multiplied signal, thereby providing a feedback signal. A second synchronous rectifier including a second multiplier, for multiplying the modulated signal with a pilot tone that has been phase shifted 90 degrees by a phase shifter, and a second filter, for filtering the second multiplied signal. The apparatus provides a control signal for a delay element, such that the delay element dynamically delays the pilot tone thereby producing a delayed reference signal.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

The present invention will be primarily described within the context of quadrature demodulation for pilot tone based bias control of a modulator. However, it will be appreciated that other techniques functioning in a relevant manner similar to that described herein with respect to bias control will also benefit from the present invention. The present invention provides dynamic compensation for phase deviations of a pilot tone band pass filter. No manual adjustments are necessary to maintain optimal operations. The present invention also maximizes the accuracy of the modulator's control.

Figure 1:
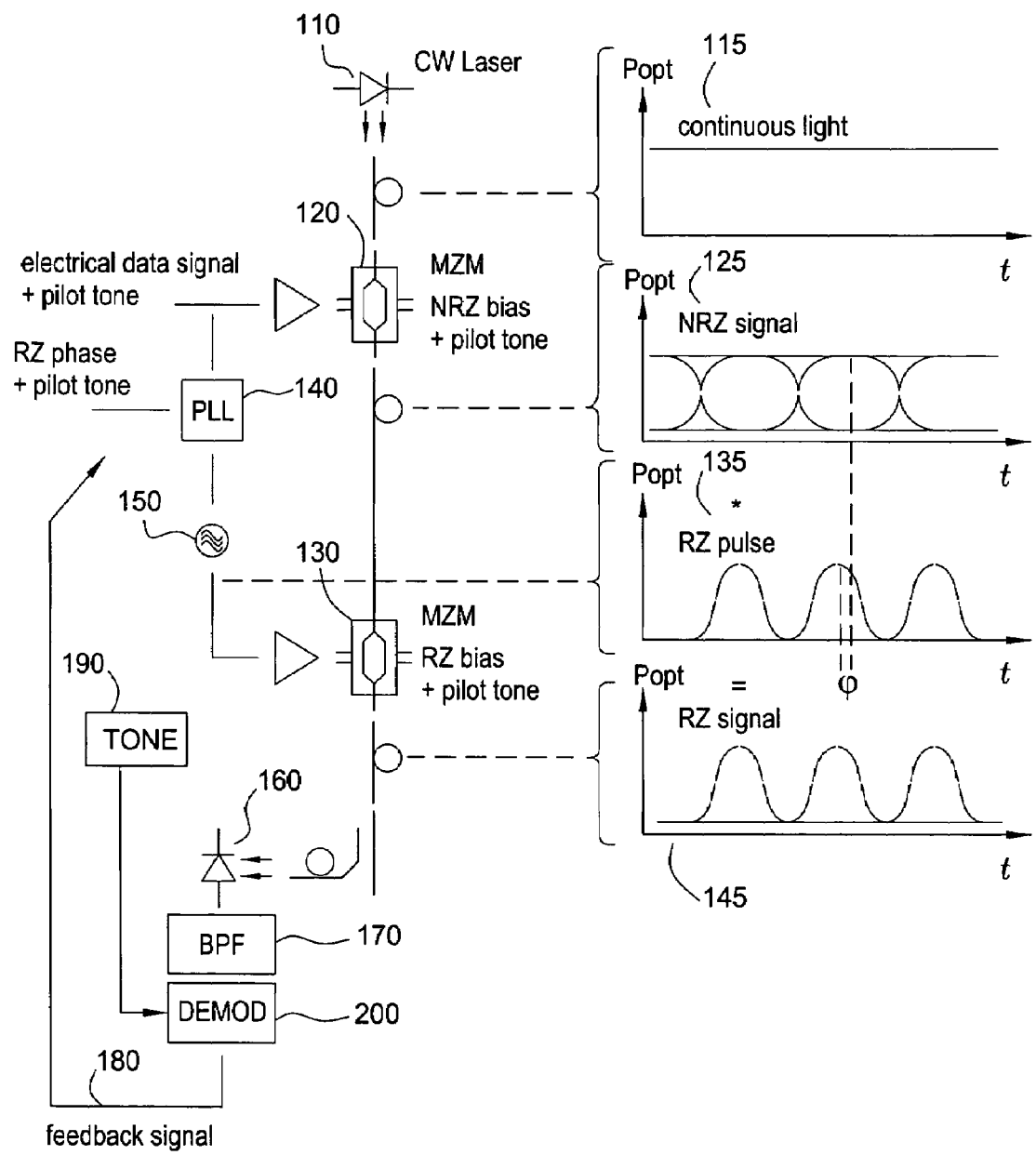
FIG. 1 depicts a high-level block diagram of an optical high speed data transmission system including a modulator bias control according to an embodiment of the present invention.

FIG. 1 depicts a high-level block diagram of an optical high speed data transmission system including a modulator bias control according to an embodiment of the present invention.

The high speed data transmission system 100 includes a continuous wave (CW) laser 110, a first modulator 120, a second modulator 130, a phase lock loop (PLL) 140, an oscillator 150, a slow photo diode 160, a band pass filter (BPF) 170, a demodulator 200, and a tone generator 190.

The CW laser 110 launches a signal with substantially constant optical power through the optical link 115, where it is modulated at a first modulator 120.

The first modulator 120 receives the signal from the CW laser 110, an electrical data signal with a pilot tone and a NRZ bias control with pilot tone. In one embodiment, the first modulator 120 is a MZM. In another embodiment, the first modulator 120 is an electron absorption modulator. Other modulators may be used to generate the NRZ signal. The first modulator generates the NRZ signal 125. In a further embodiment, the first modulator generates a RZ signal which is directly sent to the slow photo diode 160.

In the embodiment of a first modulator 120 that generates the NRZ signal 125, the NRZ signal 125 is sent to the second modulator 130. The second modulator 130 modulates the NRZ signal 125 with the RZ pulse 135 and a RZ bias control with pilot tone. In one embodiment, the second modulator 130 is a MZM. In another embodiment, the second modulator 130 is an electron absorption modulator. Other modulators may be used to generate a RZ signal. The second modulator provides the RZ signal 145 to the slow photo diode 160.

The PLL 140 and oscillator 150 receive a control signal named RZ phase with pilot tone and generate the RZ pulses 135 with the desired phase relation to the electrical data signal and transmit to the second modulator 130.

The slow photo diode 160 receives the RZ signal 145 via an optical splitter. The average optical output power variation of the output signal is measured with the slow photo diode. The slow photo diode 160 provides an output signal representing the power level of the RZ signal. The photo diode also provides the electrical voltage representative of the received optical signal.

The BPF 170 filters out the undesired frequencies and allows the electric voltage representative of the received optical signal to be send to the demodulator 200. In one embodiment, the output signal is filtered with a pilot tone band pass filter and demodulated with the help of a synchronous rectifier. The resulting signal is a measure of the bias point deviation (in terms of amplitude and phase) and can be used as feedback signal for a control loop optimizing the particular bias point.

The demodulator 200 has a synchronous rectifier. The synchronous rectifier works with a reference signal (i.e., the pilot tone), which should be in-phase to the input signal to achieve maximum feedback gain and in turn optimum control accuracy. In one embodiment, the demodulator 200 receives the electrical signal and produces a feedback signal that indicates if the bias points of the modulator need adjusting. The feedback signal is transmitted to a proportional and integral (PI) control loop (not shown), which adjust the bias points of the modulators.

A tone generator 190 provides a pilot tone to any component in the system that requires a tone. In one embodiment, a plurality of tone generators is used so each component has its own tone. In another embodiment, the tone generator is shared between the components in the system (i.e., in a time multiplexed manner).

Figure 2:
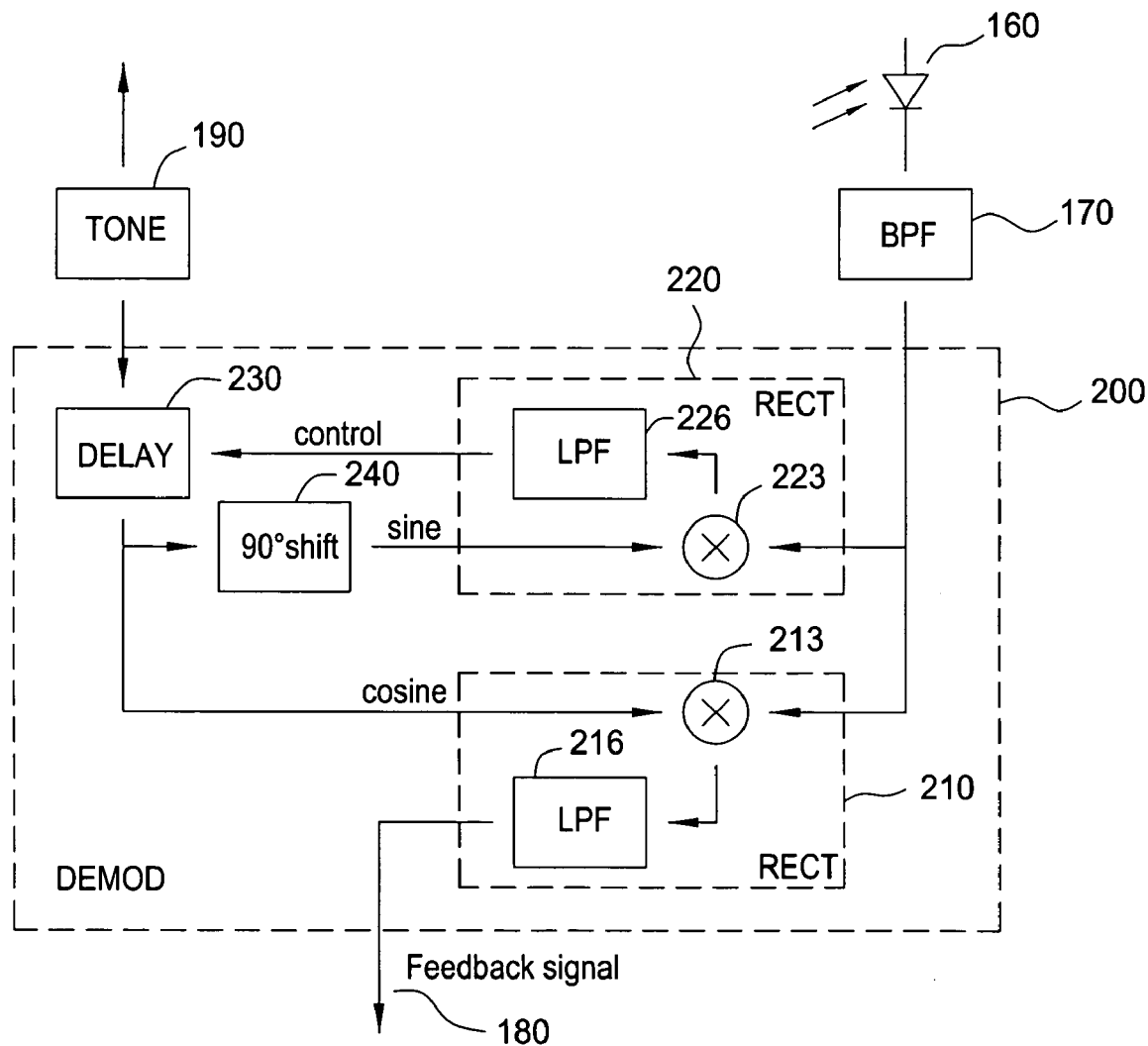
FIG. 2 depicts a high-level block diagram of a demodulator according to an embodiment of the present invention.

FIG. 2 depicts a high-level block diagram of a demodulator according to an embodiment of the present invention. The demodulator 200 includes a first synchronous rectifier 210, a second synchronous rectifier 220, a delay element 230 and a phase shifter 240.

The first synchronous rectifier 210 includes a multiplier 213 and a low pass filter (LPF) 216. The first synchronous rectifier 210 receives the band pass filtered signal from the BPF 170 and a cosine signal from the delay unit 230. Those two signals are multiplied by the multiplier 213 and sent to the LPF 216. The output signal of the LPF is the feedback signal 180.

The second synchronous rectifier 220 includes a multiplier 223 and a LPF 226. The second synchronous rectifier 220 receives the band pass filtered signal as well as a sine signal from the phase shifter 240. The band pass filtered signal and the sine signal are multiplied together by the multiplier 223. The multiplied signal is sent to the LPF 226. The output of the LPF is the control signal, which is transmitted to the delay element 230.

The delay element 230 receives the pilot tone from the tone generator 190. The delay element also receives as input the control signal from the second synchronous rectifier. The control signal dynamically adjusts the phase of the tone generator between a range of −180 degrees and 180 degrees. The output signal of the delay element is the pilot tone phase shifted by the amount indicated by the control signal. The output signal is sent to both the phase shifter 240 and to the first synchronous rectifier 210 as the cosine signal.

Figure 3:
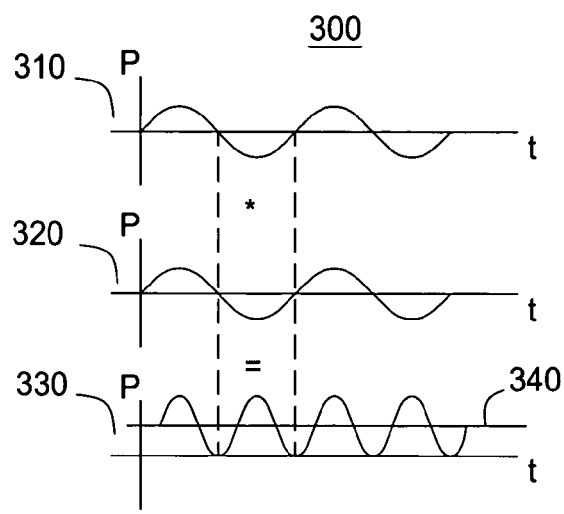
FIGS. 3-5 graphically illustrate phase deviation of the reference signal useful in understanding an embodiment of the present invention.
Figure 4:
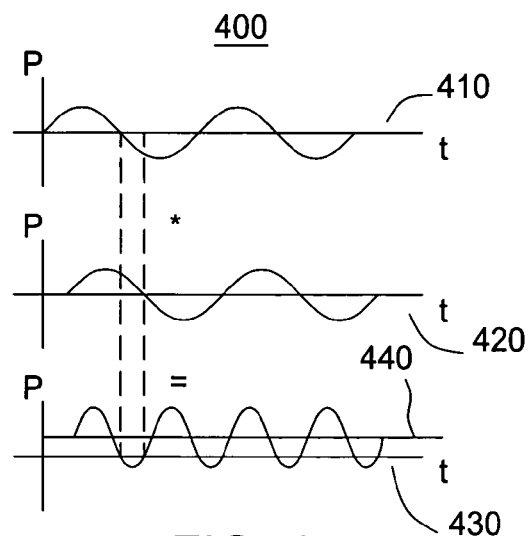
Figure 5:
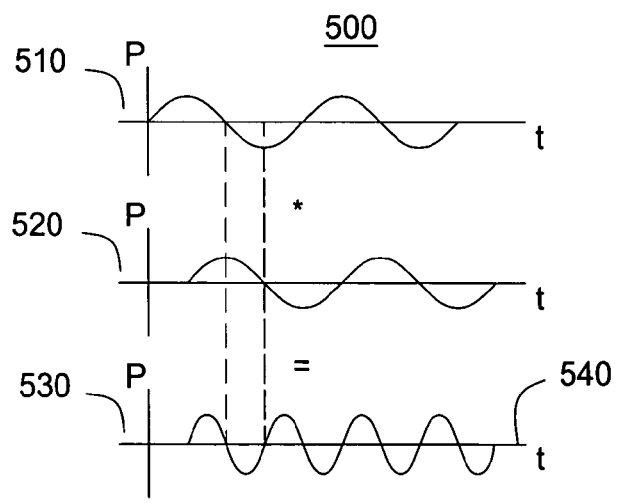

FIGS. 3-5 graphically illustrate phase deviations of the reference signal useful in understanding an embodiment of the present invention.

FIG. 3 graphically illustrates the situation when the two input signals are in-phase at the synchronous rectifier 210. The first input signal from the BFP 170 is represented by the cosine curve 310. The second input signal is from the tone generator 190 and is represented by a second cosine curve 320 that is in phase with respect to the first input signal. After the multiplier 213 multiplies the two input signals, the output signal is a cosine with twice the frequency and a DC offset 340. The LPF 216 filters the multiplied signal to obtain the DC offset. The DC offset is the rectifier output, which is used as the feedback signal 180.

FIG. 4 graphically illustrates the situation when the two input signals are slightly out of phase at the synchronous rectifier 210. The first input signal is represented by cosine curve 410 and the second cosine curve 420 is the second input from the pilot signal. The two cosine curves are multiplied by the multiplier 213 and the multiplied signal is represented by the curve 430 with a DC offset 440 that is lower than the DC offset 340. The LPF 216 filters the multiplied signal to obtain the lower DC offset.

FIG. 5 graphically illustrates the situation when the two input cosine signals are phase deviated by 90 degrees. The first cosine curve 510 represents the input signal form the BPF 170. The second cosine curve 520 represents the input signal from the tone generator 190. The multiplier 213 multiplies the two input curves. Because the second curve 520 is deviated by 90 degrees, the multiplied curve is illustrated by a multiplied curve 530. The multiplied curve has no DC offset 540. In one embodiment, the phase deviation is greater than 90 degrees and the DC offset is further decreased thereby producing a negative DC offset.

The second synchronous rectifier 220 operates substantially the same as the first synchronous rectifier 210. The pilot tone from the tone generator 190 is phase shifted by 90 degrees. The phase shifted pilot tone is multiplied with the received signal. In one embodiment, the pilot tone is a cosine signal. Thus, the multiplied signal has no DC offset as described in FIG. 5. However, if the modulators and the BPF are not optimal in terms of phase transfer, the cosine signal of the input signal from the BPF 170 is slightly phase shifted as described in FIG. 4. In that situation, the LPF 226 produces and outputs a signal having a DC offset. That DC offset is used as the control signal for the delay element 230 to adjust the amount of delay of the pilot signal. The amount of the delay shifts the pilot tone to maximize the DC offset of the feedback signal 180 as described in FIG. 3.

This invention also introduces a quadrature demodulation technique. In one embodiment, the pilot tone is a cosine signal. It can be seen as the use of two synchronous rectifiers, one working with a reference signal in phase to the pilot tone and the other one working with a phase shifted reference signal such as 90 degree deviation to the pilot tone. In another embodiment, the pilot tone is a sine signal. Any pilot tone may be used and the phase shift of the pilot signal is selected accordingly.

In one embodiment, the cosine rectifier 210 produces the control feedback signal in the same way like the state of the art solution. But it is not directly fed with the output signal of the band pass filter, but with an interleaved delay line (not shown).

The sine rectifier 220 controls that delay line to shift the phase of the incoming signal in a way that it is in phase to the pilot tone signal. The output of the sine rectifier is a measure of the actual phase deviation (in terms of amplitude and direction). It is used to vary the delay line until it becomes zero. In that case both signals are in phase. Thereby the sine rectifier dynamically compensates for any phase deviation of the pilot tone filter and in turn maximizes feedback gain of the cosine synchronous rectifier and total system performance.

In another embodiment, the same compensation behavior is achieved when the reference signal is delayed instead of the band pass filter signal (e.g., as shown in FIG. 2). This behavior is due to the symmetry of a synchronous rectifier. The advantage of the solution is that it causes less effort in digital implementations.

Figure 6:
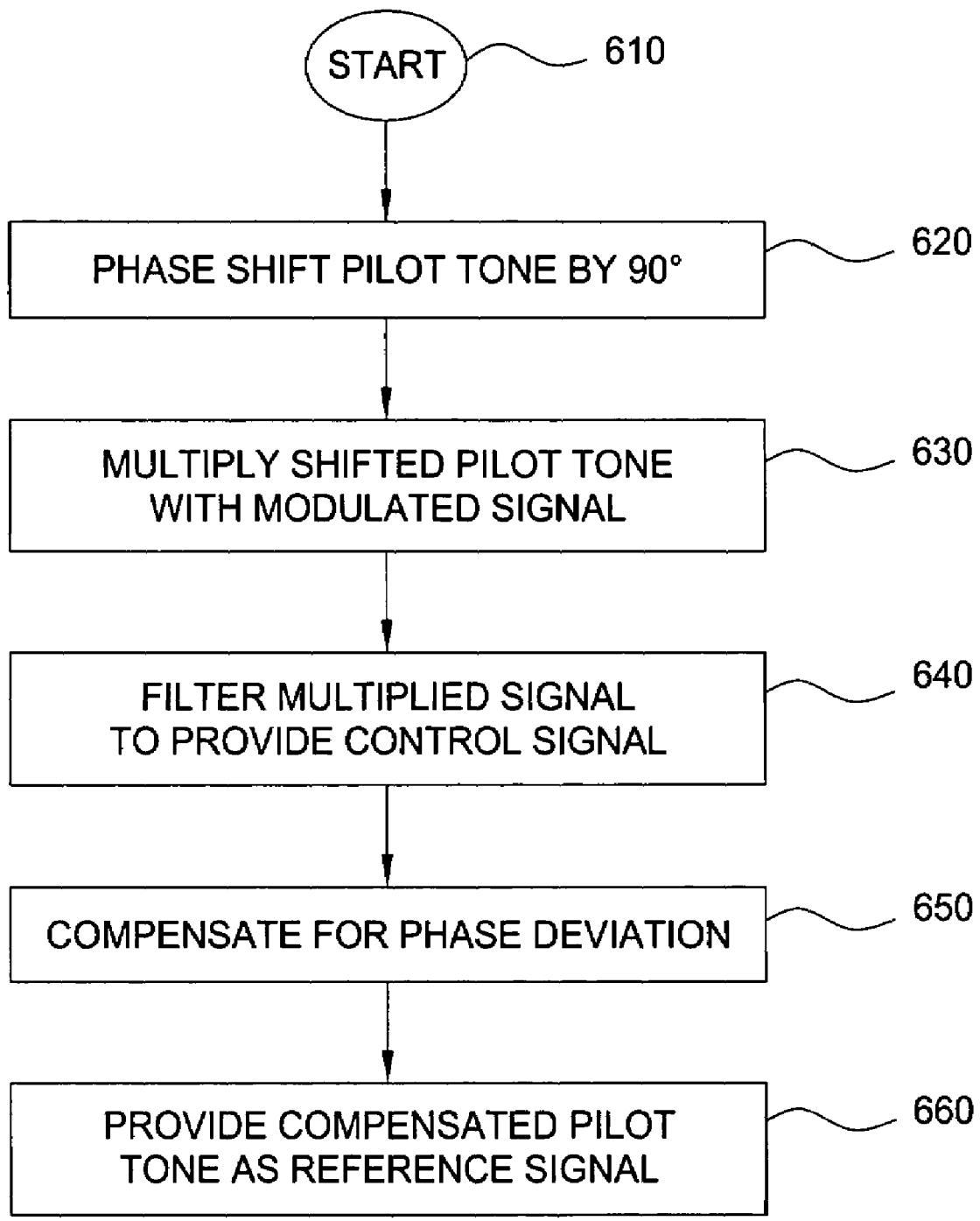
FIG. 6 depicts a flow diagram of a method according to an embodiment of the present invention.

FIG. 6 depicts a flow diagram of a method according to an embodiment of the present invention. In one embodiment, the method is accomplished in hardware such as a demodulator. In another embodiment, the method is accomplished in software, such as a computer or microcontroller or DSP program. Other embodiments to accomplish the present invention are also possible.

At step 610, the method 600 starts. The modulated RZ signal is received by the slow photo diode 160 and BPF 170. The BPF 170 conditions the signal for the demodulator 200.

At step 620, the phase shifter 240 phase shifts the pilot tone by 90 degrees. In one embodiment, the pilot tone is the same reference signal used by modulators 120 and 130 (in a time multiplexed manner). In another embodiment, each reference signal can be generated by a different tone generator. In a further embodiment, certain elements in the system share the tone generator 190 while other elements obtain the reference signal from other tone generators (not shown).

At step 630, the multiplier 223 multiplies the phase shifted reference signal with the signal from the modulators 120 and 130. The resulting signal is send to the LPF 226.

At step 640, the LPF 226 filters the multiplied signal and transmits a control signal to the delay element 230.

At step 650, the delay element 230, using the control signal, delays the received pilot signal. In one embodiment, the delaying is accomplished by phase shifting the pilot signal. In another embodiment, a time delay is used for the pilot signal. The delay element compensates for the phase deviation of the modulated signal from the modulators by determining the amount of DC offset is being received from the synchronous rectifier 220.

At step 660, the delay element provides a reference signal to the synchronous rectifier 210. The reference signal is the pilot signal after being adjusted by the control signal. Because the rectifier 210 also receives the modulated signal from the modulators 120 and 130, the reference signal has already been compensated for the phase deviation of the modulated signal. Thus, the first rectifier 210 operates with optimum gain and in turn with best performance.

Although various embodiments that incorporate the teachings of the present invention have been shown and described in detail herein, those skilled in the art can readily devise many other varied embodiments that still incorporate these teachings.

What is claimed is:

1. A method for dynamically compensating for phase deviations of a modulated optical data signal, comprising:
    shifting the phase of a pilot tone by 90 degrees;
    combining the shifted pilot tone with a modulated signal;
    filtering the combined signal to extract a control signal for a delaying element;
    delaying the pilot tone in response to the control signal; and
    providing the adjusted pilot tone as a reference signal to a first synchronous rectifier in a demodulator.

2. The method of claim 1, wherein the first rectifier produces a feedback signal.

3. The method of claim 1, wherein the modulated signal is a return-to-zero (RZ) signal.

4. The method of claim 1, wherein the pilot tone is obtained from a tone generator.

5. The method of claim 1, wherein the step of combining is performed by a multiplier.

6. The method of claim 1, wherein the delaying is accomplished by adjusting the phase of the pilot tone.

7. The method of claim 1, wherein the delaying is accomplished by a time delay to the pilot tone.

8. The method of claim 1, wherein the control signal is a DC offset and the delay is determined by an amount of the DC offset.

9. An optical demodulator, comprising:
    a first synchronous rectifier comprising:
        a first multiplier, for multiplying a modulated signal with a reference signal; and
        a first filter, for filtering the first multiplied signal, thereby providing a feedback signal; and
    a second synchronous rectifier comprising:
        a second multiplier, for multiplying the modulated signal with a pilot tone that has been phase shifted 90 degrees by a phase shifter; and
        a second filter, for filtering the second multiplied signal, thereby extracting a control signal for a delay element, wherein the element delays the pilot tone thereby producing the reference signal.

10. The demodulator of claim 9, further comprises a tone generator for providing the pilot tone.

11. The demodulator of claim 9, wherein the modulated signal is a return-to-zero (RZ) signal.

12. The demodulator of claim 9, wherein the first and second filters are low pass filters.

13. The demodulator of claim 9, wherein the delay element adjusts the phase of the pilot tone.

14. The demodulator of claim 9, wherein the delay element adjusts the pilot tone by a time delay.

15. The demodulator of claim 9, wherein the control signal is a DC offset and the delay is determined by an amount of the DC offset.

16. An apparatus for dynamically compensating for phase deviations of a modulated optical data signal, comprising:
    a phase shifter, for shifting the phase of a pilot tone by 90 degrees;
    a multiplier, for multiplying the shifted pilot tone with a modulated signal;
    a filter, for filtering the multiplied signal to extract a delay element control signal;
    a delay element, for delaying the pilot tone in response to the delay element control signal; and
    a first synchronous rectifier, for processing the adjusted pilot tone and the modulated signal to produce thereby a feedback signal.

17. The apparatus of claim 16, wherein the modulated signal comprises a return-to-zero (RZ) signal.

18. The apparatus of claim 16, wherein the delaying is accomplished by adjusting the phase of the pilot tone.

19. The apparatus of claim 16, wherein the delaying is accomplished by a time delay to the pilot tone.

20. The apparatus of claim 16, wherein the control signal comprises a DC offset and the delay is determined by an amount of the DC offset.

* * * * *